US011620419B2

(12) United States Patent
Hummelshøj (10) Patent No.: US 11,620,419 B2
(45) Date of Patent: Apr. 4, 2023

(54) SYSTEMS AND METHODS FOR IDENTIFYING HUMAN-BASED PERCEPTION TECHNIQUES

(71) Applicant: Toyota Research Institute, Inc., Los Altos, CA (US)

(72) Inventor: Jens Strabo Hummelshøj, Burlingame, CA (US)

(73) Assignee: Toyota Research Institute, Inc., Los Altos, CA (US)

( * ) Notice: Subject to any disclaimer, the term of this patent is extended or adjusted under 35 U.S.C. 154(b) by 1124 days.

(21) Appl. No.: 15/878,942

(22) Filed: Jan. 24, 2018

(65) Prior Publication Data

US 2019/0228118 A1 Jul. 25, 2019

(51) Int. Cl.
| | |
|---|---|
| *G06F 30/20* | (2020.01) |
| *G06T 19/00* | (2011.01) |
| *G06N 20/00* | (2019.01) |
| *B60W 50/08* | (2020.01) |
| *G06N 3/08* | (2006.01) |

(52) U.S. Cl.
CPC ............ *G06F 30/20* (2020.01); *G06N 20/00* (2019.01); *G06T 19/003* (2013.01); *B60W 50/08* (2013.01); *G06N 3/08* (2013.01)

(58) Field of Classification Search
CPC .......... G06F 30/20; G06N 20/00; G06N 3/08; G06T 19/003; B60W 50/08
See application file for complete search history.

(56) References Cited

U.S. PATENT DOCUMENTS

| | | | |
|---|---|---|---|
| 7,424,414 B2 | 9/2008 | Craft | |
| 8,487,775 B2 | 7/2013 | Victor et al. | |
| 8,593,272 B2 | 11/2013 | Heracles et al. | |
| 9,160,929 B2 | 10/2015 | Ro et al. | |
| 9,485,474 B2 | 11/2016 | Kim et al. | |
| 9,744,971 B2 | 8/2017 | Bigdelou | |
| 9,760,806 B1 | 9/2017 | Ning et al. | |
| 2014/0070934 A1 | 3/2014 | Chau et al. | |
| 2015/0104757 A1 | 4/2015 | Moncrief et al. | |
| 2015/0258995 A1 | 9/2015 | Essers et al. | |
| 2017/0083794 A1* | 3/2017 | Nallapa | G06N 20/00 |
| 2017/0132334 A1* | 5/2017 | Levinson | G05D 1/0088 |
| 2017/0200061 A1 | 7/2017 | Julian et al. | |
| 2018/0336297 A1* | 11/2018 | Sun | B60W 50/0205 |
| 2019/0164007 A1* | 5/2019 | Liu | G06K 9/00791 |
| 2019/0228571 A1* | 7/2019 | Atsmon | G01C 11/04 |
| 2019/0318206 A1* | 10/2019 | Smith | G01S 17/34 |

* cited by examiner

*Primary Examiner* — Eunhee Kim
(74) *Attorney, Agent, or Firm* — Christopher G. Darrow; Darrow Mustafa PC (57) ABSTRACT

System, methods, and other embodiments described herein relate to identifying human-based perception techniques for analyzing a driving scene. In one embodiment, a method includes generating the driving scene as a simulated environment of a vehicle. The method includes modifying the simulated environment according to a visualization algorithm that approximates a machine vision technique to transform the simulated environment into a modified environment with redacted information in comparison to the simulated environment. The method includes displaying the modified environment on an electronic display to an operator to assess how the operator perceives the modified environment when operating the vehicle.

20 Claims, 8 Drawing Sheets

SYSTEMS AND METHODS FOR IDENTIFYING HUMAN-BASED PERCEPTION TECHNIQUES

TECHNICAL FIELD

The subject matter described herein relates, in general, to systems and methods for varying how a driving scene is displayed to an operator of a vehicle and, more particularly, to identifying how the operator perceives the driving scene by selectively adjusting which information is displayed and assessing a response of the operator thereto.

BACKGROUND

Vehicles may be equipped with sensors that facilitate perceiving other vehicles, obstacles, pedestrians, and additional aspects of a surrounding environment. For example, a light detection and ranging (LIDAR) sensor uses light/lasers to scan the surrounding environment. Logic associated with the LIDAR then analyzes acquired scan data to detect a presence of objects and other features of the surrounding environment. In further examples, additional sensors such as cameras, radar, and so on may be implemented along with the LIDAR in a combined effort to analyze and identify aspects of the surrounding environment. In this way, an autonomous robot (e.g., autonomous vehicle) can perceive the surrounding environment and determine how to proceed within the surrounding environment.

However, analyzing data about the whole surrounding environment, especially for multiple separate sensors, represents a significant computational effort. That is, processing the large quantity of sensor data is a task that can consume a significant amount of computational time and resources. Thus, quickly making decisions within the context of a moving vehicle/robot can present difficulties associated with either accurately perceiving the surrounding environment through more extensive computations or prioritizing the speed of computations at the detriment of accuracy.

SUMMARY

In one embodiment, example systems and methods relate to a manner of identifying techniques for efficiently perceiving an environment according to human-based perceptions. Because a brute force approach to perceiving and identifying all aspects of a surrounding environment is generally too computationally intensive for quick decision making within an autonomous vehicle, a perception system and associated methods as disclosed herein provide for a manner of analyzing human perception to learn more efficient approaches to selectively perceiving a surrounding environment. That is, humans generally have innate perception abilities. In contrast to autonomous vehicles, human drivers make safe driving decisions while nonetheless using minimal effort to understand a surrounding environment. The underlying tenet is that human drivers use a small fraction of available sensory inputs to make decisions about how to safely operate the vehicle.

Specifically, human drivers use movement patterns and the like to recognize dangers and other meaningful information about a surrounding environment. Humans can then selectively focus attention on the meaningful information, and largely ignore the remaining information about other aspects of the surrounding environment. Accordingly, the presently disclosed perception system and associated methods implement functionality that reverse engineers human driver perception such that machine perception approaches can be tailored to more efficiently process sensor data and recognize important aspects about a driving scene.

For example, the perception system, in one embodiment, is integrated with a driving simulator or other device that can display driving scenarios to an operator. More specifically, the perception system can adapt how the driving scenarios are displayed such that a visualization of the driving scenario is varied to include less information than is generally available when the operator is viewing the surrounding environment through a windshield. That is, the visualization of the driving scenario is modified according to a visualization algorithm that approximates a machine vision technique.

Thus, the perception system, in one embodiment, modifies the visualization to provide a reduced/modified view of the driving scenario to the operator. Accordingly, as the operator provides driving inputs while perceiving the modified view, the perception system can grade or otherwise assess whether the operator is controlling the vehicle in a safe or generally acceptable manner for the present driving conditions. In this way, the perception system determines whether the machine vision technique associated with the modified view and that uses a reduced input set of the sensor data is a sufficient manner of processing the sensor data when controlling the vehicle autonomously.

As an additional note, the perception system, in one embodiment, grades/assesses an ability of the operator to control the vehicle while viewing the modified view under various circumstances. The circumstances can include different driving conditions such as various weather conditions, lighting conditions, and so on. Thus, the perception system may determine that the particular machine vision technique is acceptable under some driving conditions but not for other driving conditions as assessed via the driving inputs.

Moreover, as noted, the visualization algorithms are separately correlated with machine vision techniques to visually approximate information that the machine vision techniques accept as input. Accordingly, the perception system, in one embodiment, varies how the visualizations are adjusted according to different visualizing algorithms to assess, for example, different combinations of machine vision techniques under different circumstances. Thus, in one embodiment, the perception system dynamically varies which visualization algorithm modifies the visualization of the driving scene as a function of changing driving conditions, feedback about driving inputs, and/or according to other criteria. In this way, the perception system reverse engineers how a human operator perceives the surrounding environment while operating the vehicle and correlates the ways in which the human operator perceives the surrounding environment with machine vision techniques. Accordingly, the perception system provides determinations of which machine vision techniques improve machine perception under different driving circumstances through processing a select subset of sensor data in order to achieve improved perception with less computational effort.

In one embodiment, a perception system for identifying human-based perception techniques for analyzing a driving scene is disclosed. The integrated display system includes one or more processors and a memory communicably coupled to the one or more processors. The memory stores a scene module including instructions that when executed by the one or more processors cause the one or more processors to generate the driving scene as a simulated environment of a vehicle. The scene module includes instructions to modify the simulated environment according to a visualization algorithm that approximates a machine vision technique to transform the simulated environment into a modified environment with redacted information in comparison to the simulated environment. The memory stores an interface module including instructions that when executed by the one or more processors cause the one or more processors to display the modified environment on an electronic display to an operator to assess how the operator perceives the modified environment when operating the vehicle.

In one embodiment, a non-transitory computer-readable medium for identifying human-based perception techniques for analyzing a driving scene and including instructions that when executed by one or more processors cause the one or more processors to perform one or more functions. The instructions include instructions to generate the driving scene as a simulated environment of a vehicle. The instructions include instructions to modify the simulated environment according to a visualization algorithm that approximates a machine vision technique to transform the simulated environment into a modified environment with redacted information in comparison to the simulated environment. The instructions include instructions to display the modified environment on an electronic display to an operator to assess how the operator perceives the modified environment when operating the vehicle.

In one embodiment, a method for identifying human-based perception techniques for analyzing a driving scene is disclosed. In one embodiment, a method includes generating the driving scene as a simulated environment of a vehicle. The method includes modifying the simulated environment according to a visualization algorithm that approximates a machine vision technique to transform the simulated environment into a modified environment with redacted information in comparison to the simulated environment. The method includes displaying the modified environment on an electronic display to an operator to assess how the operator perceives the modified environment when operating the vehicle.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements or multiple elements may be designed as one element. In some embodiments, an element shown as an internal component of another element may be implemented as an external component and vice versa. Furthermore, elements may not be drawn to scale.

DETAILED DESCRIPTION

Systems, methods and other embodiments associated with identifying techniques for efficiently perceiving an environment according to human-based perceptions are disclosed. As mentioned previously, a vehicle may include multiple sensors for perceiving aspects of the surrounding environment. Moreover, autonomous driving systems or other systems within the vehicle process sensor data from the sensors to perceive aspects of the surrounding environment. However, in general, the noted systems use a brute force approach for processing the sensor data that can be computationally intensive and thus inefficient for use in time-sensitive applications and/or mobile applications with reduced computational ability.

Therefore, in one embodiment, a perception system identifies improved perception techniques for processing the sensor data according to observations of how humans perceive surroundings when driving. In one embodiment, the perception system selectively modifies how a driving scene is displayed to an operator of a vehicle. By modifying how the driving scene is displayed, the perception system can log characteristics about how the operator perceives the surrounding environment to provide controls to the vehicle. That is, in one approach, the perception system modifies a visualization of the driving scene according to a selected visualization algorithm. The selected visualization algorithm corresponds to a machine vision technique and, thus, is implemented by the perception system to modify the visualization in a manner that corresponds with a character and quantity of information used by the machine vision technique to perceive the surroundings. Accordingly, the perception system can then monitor whether the operator is able to sufficiently control the vehicle to determine whether the associated machine vision technique adequately approximates the manner in which the operator perceives the surrounding environment. In other words, the perception system determines whether the operator can control the vehicle when presented with the limited set of information.

As a further matter before proceeding with additional discussion of the perception system, it should be noted that the vehicle, as referred to herein, can be a simulator of a vehicle that is, for example, configured with one or more displays for presenting the noted visualizations of a simulated driving environment to the operator. Moreover, the simulator can include additional components as may be commonly encountered within a vehicle such as a steering wheel, control pedals, a dash, dials, indicators, and so on. In still further embodiments, the simulator is implemented within a functional vehicle by integrating display screens within the vehicle, providing for virtual reality interfaces, providing for augmented reality interfaces, and so on.

By way of example and as further explanation of how the perception system modifies the visualization, the perception system can display a segment or a small sub-region of collected sensor data that is focused on a particular object. Alternatively, the perception system may modify the visualization by applying a color filter, outlining particular objects using bounding boxes, reducing detail (e.g., resolution) of the visualization, displaying only moving portions of the surroundings, or by modifying the visualization according to another technique such that information that is displayed to the operator is commensurate with the extent of information accepted or produced by the corresponding machine vision technique when perceiving the surrounding environment.

Accordingly, the perception system can display the visualization of the driving scene using different visualization techniques to test whether the form and extent of the information displayed is sufficient for the operator to control the vehicle. In one embodiment, the perception system assesses control of the vehicle by monitoring for and logging inputs generated by the operator. That is, the perception system, in one aspect, monitors for electronic control signals that are generated when the operator manually manipulates the driving controls. Because the operator is manipulating the controls according to limited information displayed as a function of the visualization algorithm, the perception system can score the inputs from the operator as to whether the inputs are sufficient to safely control the vehicle when provided the limited information.

Furthermore, the perception system, in one embodiment, logs the inputs to subsequently determine whether the controls are sufficient. However, in another approach, the perception system can dynamically adjust which visualization algorithm is modifying the visualization when, for example, the perception system determines the inputs are insufficient, according to current attributes of the driving scene, or according to other conditions (e.g., operator request). In either case, the perception system provides the visualization within a display to the operator using one of the visualization algorithms that modifies information provided to the operator into a subset of information. In this way, the perception system can test which information is useful to the operator under various conditions and, thus, identify machine vision approaches that correlate with the visualization algorithm to improve the efficiency of processing sensor data such that a particular processing or reduced set of information can be applied instead of a brute force approach.

Figure 1:
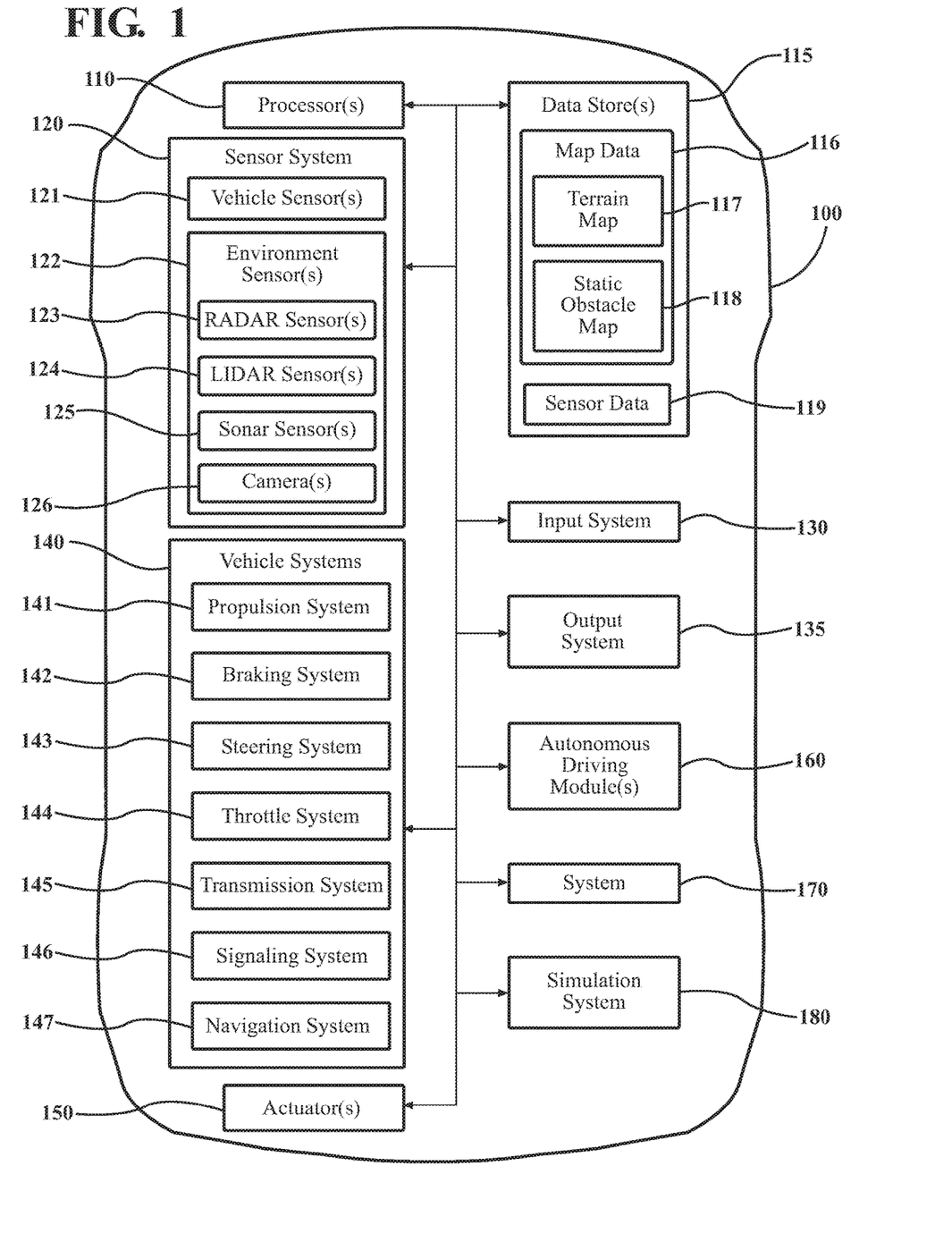
FIG. 1 illustrates one embodiment of a vehicle within which systems and methods disclosed herein may be implemented.

Referring to FIG. 1, an example of a vehicle 100 is illustrated. As used herein, the vehicle 100 is generally a vehicle simulator that includes a display positioned in a manner so as to simulate views of a surrounding environment of the vehicle 100 to the operator. Of course, in further embodiments, the display may instead be a virtual reality head-mounted device (HMD) or augmented reality HMD. Moreover, the vehicle simulator can include control pedals (e.g., accelerator, brake, clutch), a steering wheel, shifter, and other control devices that may be within a vehicle. As disclosed herein, components of the vehicle simulator are, in one aspect, embodied within a simulation system 180. The simulation system 180 can be integrated with a standard functional vehicle or may be a stand-alone system that is independent of an actual vehicle.

Furthermore, the vehicle 100 and the integrated simulator may be any form of motorized transport. In one or more implementations, the vehicle 100 is a simulated automobile. While arrangements will be described herein with respect to automobiles, it will be understood that embodiments are not limited to automobiles. In some implementations, the vehicle 100 may be any form of motorized transport that, for example, can include an operator/driver, and thus benefits from the functionality discussed herein.

The vehicle 100 also includes various elements. It will be understood that in various embodiments it may not be necessary for the vehicle 100 to have all of the elements shown in FIG. 1. The vehicle 100 can have any combination of the various elements shown in FIG. 1. Further, the vehicle 100 can have additional elements to those shown in FIG. 1. In some arrangements, the vehicle 100 may be implemented without one or more of the elements shown in FIG. 1. While the various elements are shown as being located within the vehicle 100 in FIG. 1, it will be understood that one or more of these elements can be located external to the vehicle 100. Further, the elements shown may be physically separated by large distances.

Some of the possible elements of the vehicle 100 are shown in FIG. 1 and will be described along with subsequent figures. However, a description of many of the elements in FIG. 1 will be provided after the discussion of FIGS. 2-6 for purposes of brevity of this description. Additionally, it will be appreciated that for simplicity and clarity of illustration, where appropriate, reference numerals have been repeated among the different figures to indicate corresponding or analogous elements. In addition, the discussion outlines numerous specific details to provide a thorough understanding of the embodiments described herein. Those of skill in the art, however, will understand that the embodiments described herein may be practiced using various combinations of these elements.

In either case, the vehicle 100 includes a perception system 170 that is implemented to perform methods and other functions as disclosed herein relating to integrating representations of detected objects within a display of the vehicle 100 such as a navigational display or other display that provides contextual information to occupants. As previously indicated, the vehicle 100 may be a standalone simulator device. Thus, in a similar fashion, in one embodiment, the perception system 170 is independent from the vehicle 100 and is implemented as an independent device. The noted functions and methods will become more apparent with a further discussion of the figures.

Figure 2:
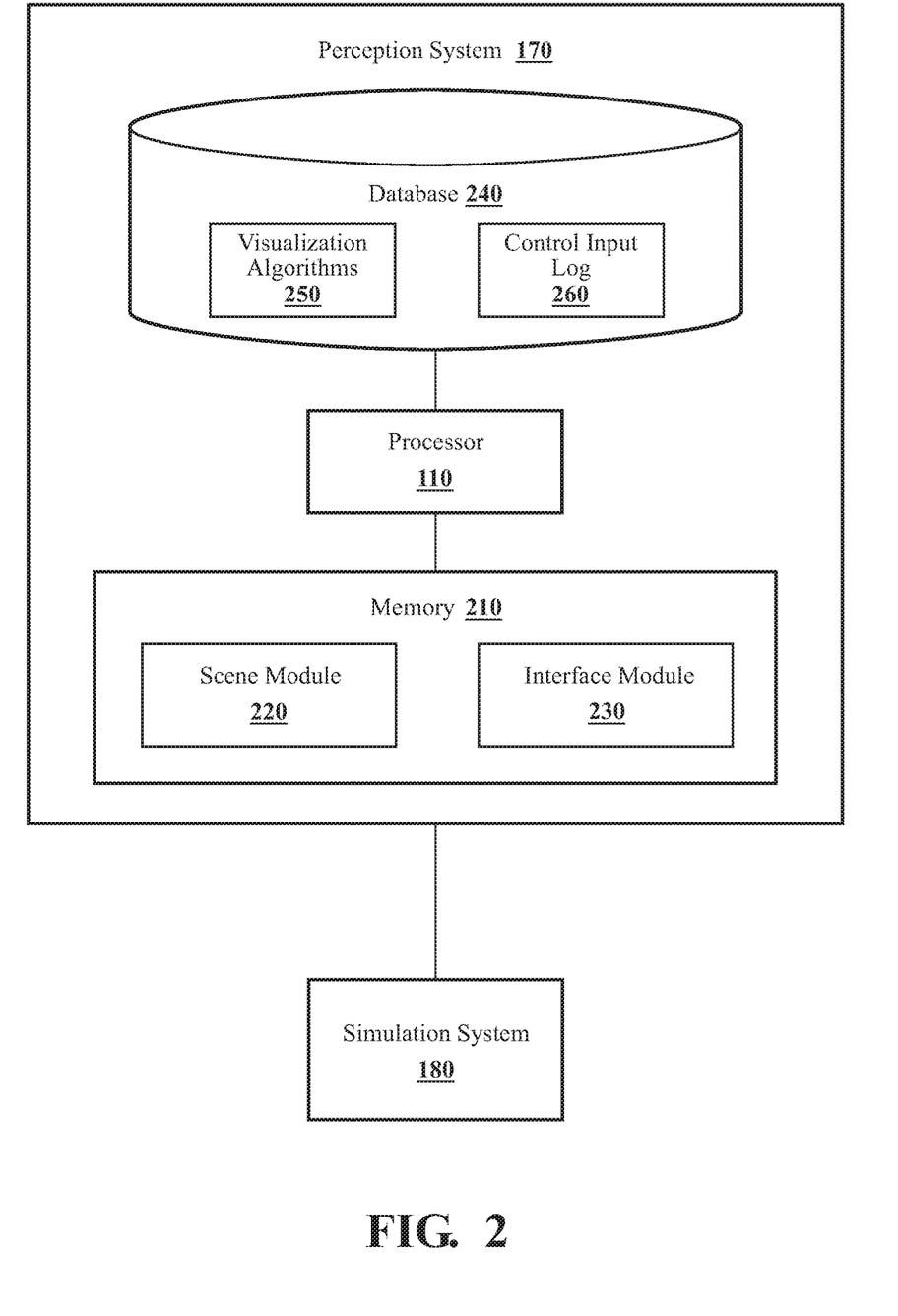
FIG. 2 illustrates one embodiment of a perception system that is associated with selectively modifying how information is displayed to a vehicle operator for assessing how the operator perceives the surrounding environment.

With reference to FIG. 2, one embodiment of the perception system 170 of FIG. 1 is further illustrated. The perception system 170 is shown as including a processor 110 from the vehicle 100 of FIG. 1. Accordingly, the processor 110 may be a part of the perception system 170, the perception system 170 may include a separate processor from the processor 110 of the vehicle 100 or the perception system 170 may access the processor 110 through a data bus or another communication path. In one aspect, the processor 110 is part of the simulation system 180 and the perception system 170 accesses the processor 110 over a data bus. In either case, the processor 110 is configured to execute the disclosed instructions to achieve the noted functionality.

In one embodiment, the perception system 170 includes a memory 210 that stores a scene module 220 and an interface module 230. The memory 210 is a random-access memory (RAM), read-only memory (ROM), a hard-disk drive, a flash memory, or other suitable memory for storing the modules 220 and 230. The modules 220 and 230 are, for example, computer-readable instructions that when executed by the processor 110 cause the processor 110 to perform the various functions disclosed herein.

Accordingly, the scene module 220 generally includes instructions that function to control the processor 110 to generate a visual driving scene that is a simulation of a surrounding environment of the vehicle 100. In one embodiment, the scene module 220 builds the simulation from a feature map or another specification that defines attributes, objects, and other aspects of the surrounding environment that is to be simulated. In further aspects, the scene module 220 selects a set of previously gathered sensor data (e.g., video, LIDAR data, etc.) that the scene module 220 transforms into the simulation. In one embodiment, the scene module 220 transforms the sensor data by, for example, annotating the sensor data with expected control inputs so that the interface module 230 can subsequently score received control inputs to assess how well the operator controlled the vehicle 100 while receiving reduced information about the surrounding environment.

In either case, the sensor data can include, for example, scan data that embodies observations of one or more objects in a surrounding environment proximate to the vehicle 100 and/or other aspects about the surroundings. In general, as provided for herein, the sensor data is from any variety of sensors of the sensor system 120 and may include observations of the surrounding environment including information about trajectories and further aspects of objects.

Moreover, the scene module 220 selects, in one embodiment, one of the visualization algorithms 250 with which to modify the visualization of the driving scene. In general, each of the visualization algorithms 250 correlate with a separate machine vision technique. The machine vision techniques are processing techniques that may be implemented by, for example, an autonomous vehicle, advanced driver assistance system, or another computing system that receives raw sensor data and processes the sensor data to perceive aspects of the surrounding environment. Accordingly, the machine vision techniques can include image filtering, object recognition, pattern detection, semantic segmentation, lane detection, obstacle detection, image segmentation (e.g., open space segmentation, bounding box segmentation, super-pixel segmentation, pixel segmentation), and so on.

Moreover, the machine vision techniques can include not only a manner of modifying the visualization from the perspective of a quantity of data (e.g., localizing a particular sub-region of the surrounding environment for analysis), but also in relation to a quality of data (e.g., reductions in resolution), and/or computer-generated elements that are added to the sensor data (e.g., bounding boxes, etc.). Consequently, the scene module 220 selects a particular visualization algorithm that corresponds to a machine vision technique according to, for example, characteristics of how that particular technique may be applied. As a further matter, the visualization algorithm can approximate the machine vision technique through the manner in which the overall visualization is modified. That is, because some machine vision techniques may not directly correspond to an inherent manner of adjusting the visualization, some of the machine vision techniques such as approaches for processing LIDAR data may be approximated by the corresponding visualization algorithm. Thus, the perception system 170, in one embodiment, generates computer graphics according to raw sensor data from a particular sensor and a manner in which a machine vision technique may alter the raw sensor data.

Furthermore, in one embodiment, the perception system 170 includes the database 240. The database 240 is, in one embodiment, an electronic data structure stored in the memory 210 or another data store and that is configured with routines that can be executed by the processor 110 for analyzing stored data, providing stored data, organizing stored data, and so on. Thus, in one embodiment, the database 240 stores data used by the modules 220 and 230 in executing various functions. In one embodiment, the database 240 includes visualization algorithms 250 along with, for example, a control input log 260 and/or other information that is used by the modules 220 and 230.

In either case, the scene module 220, in one embodiment, selects one of the visualization algorithms 250 with which to modify the visualization of the simulated surrounding environment of the vehicle 100. As an additional note, the scene module 220, in one embodiment, randomly selects which of the visualization algorithms 250 will be applied. Alternatively, the scene module 220, in one embodiment, selects one of the visualization algorithms 250 or a combination of two or more of the visualization algorithms according to attributes of the surrounding environment. That is, the scene module 220 can select the particular visualization algorithm according to such attributes as lighting (e.g., dark vs. sunny), weather (e.g., snow, rain, etc.), traffic conditions, and other attributes that may be available for informing how perception of the surrounding environment may be presently affected.

Once the scene module 220 selects at least one of the visualization algorithms 250, the scene module 220 further proceeds by preparing the visualization for display. For example, the scene module 220 applies the visualization algorithm 250 to the visualization of the simulated environment to generate a modified visualization/environment that includes, for example, only information that would be used by a corresponding machine vision technique when analyzing the surrounding environment. Accordingly, the modified visualization can include a sub-portion of the original visualization that is focused on a particular aspect (e.g., lane markers) or group of objects (e.g., nearby vehicles) within the simulated environment. Moreover, the modified visualization may include additional labels, boxes, filtering, or other aspects that are in addition to the original visualization of the simulated environment. Additionally, it should be appreciated that while the scene module 220 is generally discussed as modifying the visualization of the driving scene, in one embodiment, the scene module 220 generates the modified visualization at first instance using the selected visualization algorithm instead of generating the modified visualization in a two-step format.

In one embodiment, the interface module 230 generally includes instructions that function to control the processor 110 to render the modified visualization of the simulated environment. The interface module 230 can display the modified visualization at a corresponding location within an electronic display of, for example, the simulation system 180 to convey the modified visuals to the operator.

The interface module 230 generally displays the modified visualization as a video or other moving image/animation of the surrounding environment. Commensurate with displaying the modified visualization, the interface module 230 monitors for electronic control inputs that are generated when the operator manually manipulates control input devices (e.g., steering wheel, pedals, etc.) of the vehicle 100. In one embodiment, the interface module 230 logs the electronic control inputs in the control input log 260 along with, for example, an indication of the corresponding visualization algorithm(s) and the particular timestamp of the sensor data.

Alternatively, or additionally, the interface module 230 can score the control inputs to determine whether the operator is adequately controlling the vehicle 100 while being provided with the limited view of the simulated environment. The score can provide insights about whether the corresponding machine vision technique is a suitable approach under the circumstances presented to the operator. In further aspects, the interface module 230 can dynamically adjust how the visualization is modified if, for example, the score indicates that the operator is not capable of adequately controlling the vehicle 100 which indicates that the provided information may not be sufficient.

Additionally, the interface module 230, in one embodiment, can also further analyze the control inputs log 260 using a machine learning algorithm to identify which corresponding machine vision techniques provide for improving processing of the sensor data while also permitting the vehicle 100 to be adequately controlled. Through this analysis, the interface module 230 ascertains which machine vision techniques improve perception for autonomous driving systems such that more focused sensor data is used to perceive the surrounding environment instead of using a brute force approach.

Figure 3:
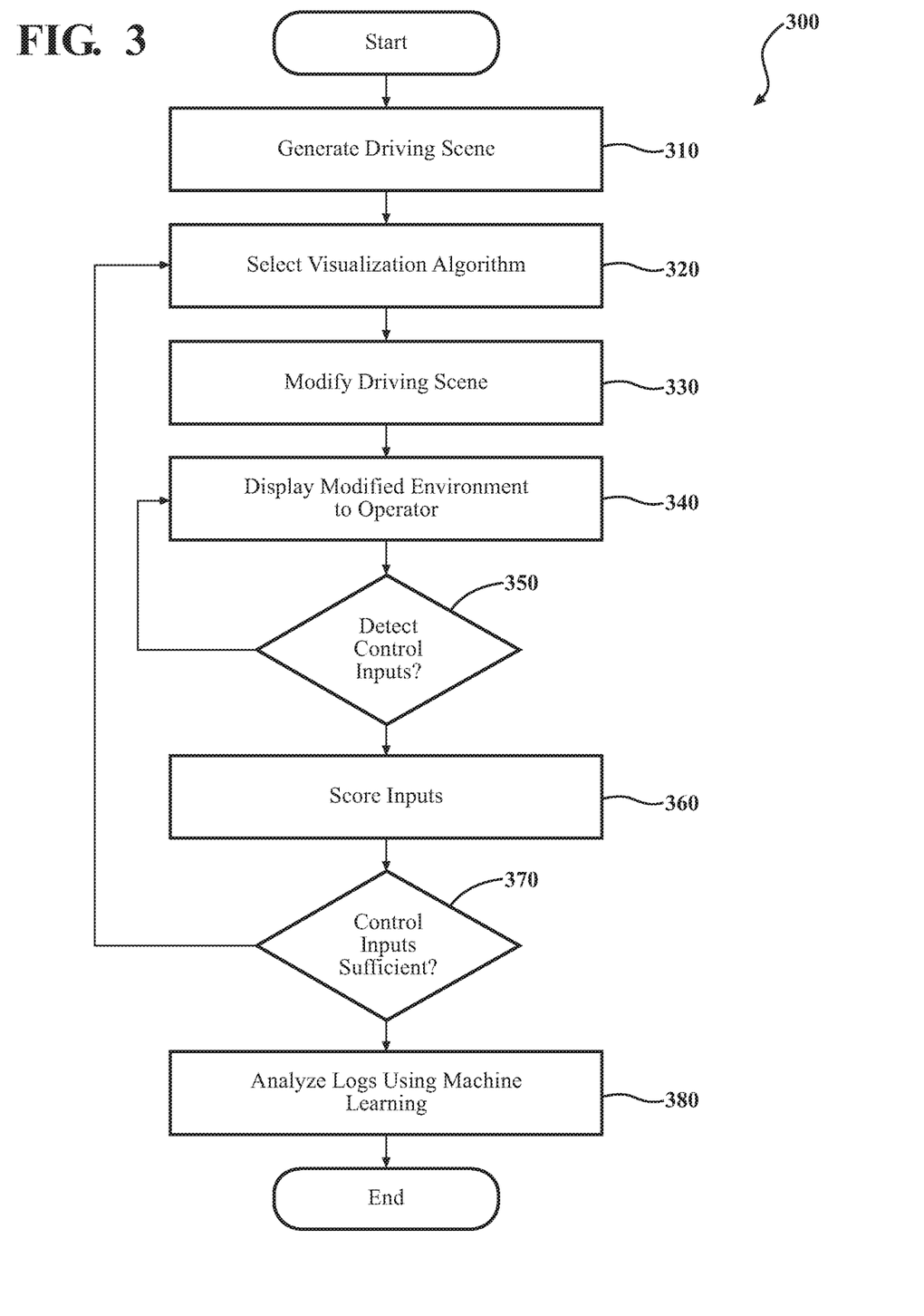
FIG. 3 illustrates one embodiment of a method associated with varying an amount and type of information that is provided to a vehicle operator to ascertain how the vehicle operator perceives a surrounding environment.

Additional aspects of identifying human-based perception techniques for analyzing a driving scene will be discussed in relation to FIG. 3. FIG. 3 illustrates a flowchart of a method 300 that is associated with modifying a visual scene displayed to an operator in order to assess improved approaches to perceiving an environment. Method 300 will be discussed from the perspective of the perception system 170 of FIGS. 1, and 2. While method 300 is discussed in combination with the perception system 170, it should be appreciated that the method 300 is not limited to being implemented within perception system 170, but is instead one example of a system that may implement the method 300.

At 310, the scene module 220 generates the driving scene as a simulated environment of the vehicle 100. As mentioned previously, the scene module 220 generates the driving scene from sensor data that has been previously acquired. Thus, the scene module 220, in one embodiment, generates the driving scene as a reconstructed simulation of an environment through which actual sensor data has been collected. The sensor data can include camera images, LIDAR data, radar data, and so on. Moreover, the sensor data can also include additional secondary sensor data that may not be directly related to perceiving the environment but which may inform annotations/labels of the sensor data. Thus, the secondary sensor data may be electronic control input information from when the sensor data was collected, telematics data, and so on.

Alternatively, the scene module 220, in one embodiment, artificially generates the driving scene as an interactive three-dimensional environment. Thus, the scene module 220 may initially construct the simulated environment as a map of a roadway and then populate the map with various objects in order to arrange a particular driving scenario. In further approaches, the scene module 220 generates the simulated environment from real-world roadmaps and uses various computer generation methods to populate the simulated environments with objects, weather, and so on. In either case, the driving scene is a depiction of an environment through which a vehicle may travel and can include various road conditions, traffic arrangements, obstacles, and other circumstances that may be encountered when operating a vehicle and that, more specifically, may influence how an operator perceive aspects of the environment. In this way, the perception system 170 can generate various driving circumstances to assess how the operator perceives different and changing aspects of the surrounding environment.

At 320, the scene module 220 selects the visualization algorithm. In one embodiment, the scene module 220 selects one of the visualization algorithms 250 according to attributes of the driving scene. That is, in response to attributes of the driving scene such as light conditions, the scene module 220 can select a particular one of the algorithms 250 that is designed for or has characteristics that perform better under the noted conditions. Thus, the scene module 220 can dynamically adapt how the visualization is modified according to the attributes so that, in one embodiment, a preferred one of the algorithms 250 is selected for corresponding conditions.

As previously mentioned, in various embodiments, the scene module 220 selects one of the algorithms 250 at random and executes the whole driving scenario (e.g., a trip) with each one of the algorithms 250 individually in order to acquire a complete set of data over the whole driving scene. In this manner, the perception system 170 can collect a complete data sampling for each of the algorithms 250 and compare performances in order to identify which of the algorithms 250 improve performance and under which conditions. In either case, the scene module 220 executes selected ones of the visualization algorithms 250 to visually approximate how the respective machine vision techniques perceive the driving scene.

At 330, the scene module 220 modifies the simulated environment according to a visualization algorithm that approximates a machine vision technique to transform the simulated environment into a modified environment. In one embodiment, the visualization algorithm is applied to the simulated environment as a manner of masking or otherwise transforming the sensor data or electronic representation of the simulated environment such that visuals rendered therefrom within an electronic display represent a reduced form or set of information. That is, in one or more approaches, the modified environment masks from view certain regions within the simulated environment such that information that is available to the operator is a redacted version in comparison information of the simulated environment in a broader sense.

As previously discussed, the scene module 220 uses the visualization algorithm to apply one or more techniques to modify which aspects of the driving scene are displayed to the operator. As a general approach, the algorithms 250 focus on select aspects of the simulated environment in order to improve processing efficiency through processing a subset of available sensor data. However, the algorithms 250 include approaches that add indicators into the sensor data, highlight certain portions of the sensor, monochromatically filter the sensor data, and so on. In still further aspects, two or more of the algorithms 250 can be executed in concert to isolate and analyze a particular segment of the simulated environment. In this way, the scene module 220 uses the algorithms 250 to process a subset of information and improve processing of the sensor data such that, for example, only data that is relevant to the operation of the vehicle 100 is analyzed.

At 340, the interface module 230 displays the modified environment on an electronic display to an operator. In one embodiment, the interface module 230 renders the modified environment as altered using the selected one of the algorithms 250 on an electronic display of the similar system 180. The reduced set of data embodied by the modified environment is provided by the interface module 230 to assess how the operator perceives aspects of the environment when operating the vehicle 100. In other words, the perception system 170 displays a reduced/modified set of information to the operator in order to determine which data and in what form is needed by the operator to control the vehicle 100.

At 350, the interface module 230 monitors for electronic inputs of the vehicle 100 that are generated by an operator. In general, the interface module 230 monitors for the inputs to determine whether the operator is controlling the vehicle 100 in a sufficient manner as discussed further subsequently. In either case, as the interface module 230 detects the inputs, the interface module 230 logs the inputs into the log 260 as correlating with a particular portion of the driving scene and a particular one of the visualization algorithms 250. In this way, the interface module 230 collects information about how the operator responds to the sub-set of information instead of being provided with the ability to perceive the whole driving scene.

At 360, the interface module 230 scores the inputs collected at 350. In one embodiment, the interface module 230 scores the inputs by determining whether the inputs satisfy a driving threshold. In general, the driving threshold indicates whether the vehicle is being adequately controlled through the driving scene. In other words, the driving threshold sets forth a manner of controlling the vehicle 100 that indicates a safe path of travel within acceptable speeds through the driving scene and without colliding with or nearly colliding with obstacles/objects. Thus, the interface module 230 can indicate in a binary format (e.g., yes or no) whether the inputs satisfy the threshold or not. Of course, in further instances the interface module 230 can indicate the score at a more granular level (e.g., on a scale of 0-100) in order to provide for more extensive analysis.

In further aspects, the interface module 230 scores the inputs by comparing the inputs with recorded inputs from when the sensor data was collected. That is, the interface module 230 can compare the inputs from the operator with original inputs to determine how closely the present inputs are in relation to the original inputs. The interface module 230 can then compare the score with the driving threshold to determine whether the inputs are within an acceptable margin of error of the original inputs.

At 370, the interface module 230 determines whether the control inputs are adequate. In one embodiment, the interface module 230 indicates when the control inputs are out of bounds (e.g., insufficient) to the scene module 220 so that the scene module 220 can adapt which of the algorithms 250 are used to modify the driving scene. In this way, the perception system 170 can customize the visualization such that the operator is provided with various displays of information for the driving scene and a best-fit can be determined.

At 380, the interface module 230 analyzes, using a machine learning algorithm, the log 260. In one embodiment, the machine learning algorithm is a neural network or another deep learning algorithm. The interface module 230 uses the machine learning algorithm to learn which of the machine vision techniques that are associated with the visualization algorithms 250 can improve on machine perception techniques in various circumstances according to human-based perception observations.

Thus, the interface module 230 trains the machine learning algorithm to recognize which of the algorithms 250 provide adequate perceptions. In one embodiment, the machine learning algorithm accepts sensor data as an input and indicates which of the machine techniques is to be applied to the sensor data to provide for an efficient analysis. Thus, the interface module 230 can train the machine learning algorithm using the log 260 which correlates the abilities of the techniques with human-based perceptions. In this way, the perception system 170 can reverse engineer how the human operator processes sub-sets of data to achieve full perceptions of the surrounding environment and thus can selectively apply particular techniques.

Figure 4:
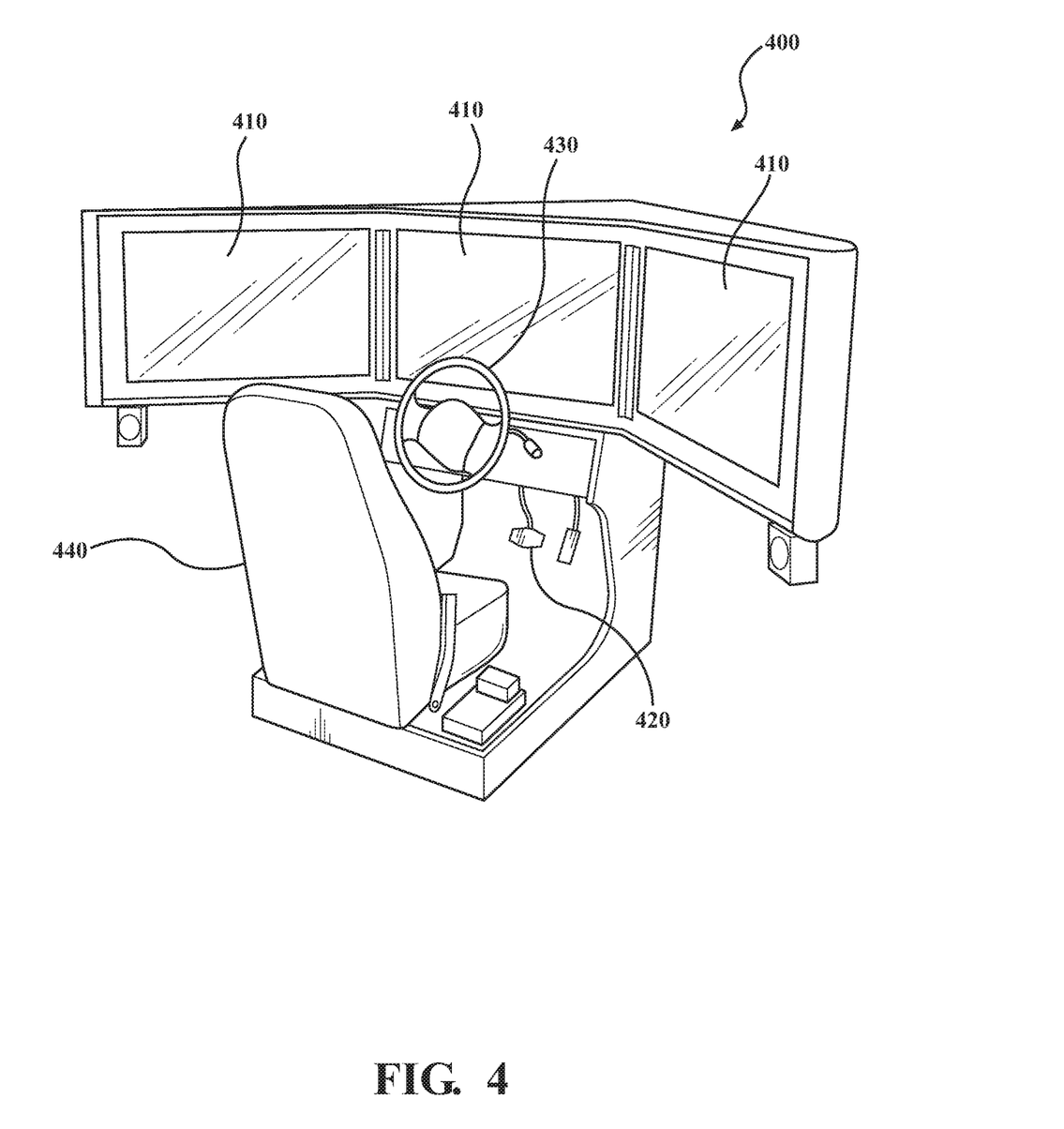
FIG. 4 is a diagram illustrating an example of a simulator within which the disclosed systems and methods may be implemented.

With reference to FIG. 4, one example of the vehicle 100 as a simulator 400 is illustrated. In FIG. 4, the simulator 400 includes multiple displays 410 for displaying the modified environment to the operator. Moreover, the simulator 400 includes control pedals 420, a steering wheel 430, and a seat 440. Thus, the perception system 170 displays the modified environment on the displays 410 to the operator and monitors for controls from the steering wheel 430 and the pedals 420. In this way, the perception system 170 can collect information about how the operator perceives various aspects of the environment when controlling the vehicle.

Figure 5A:
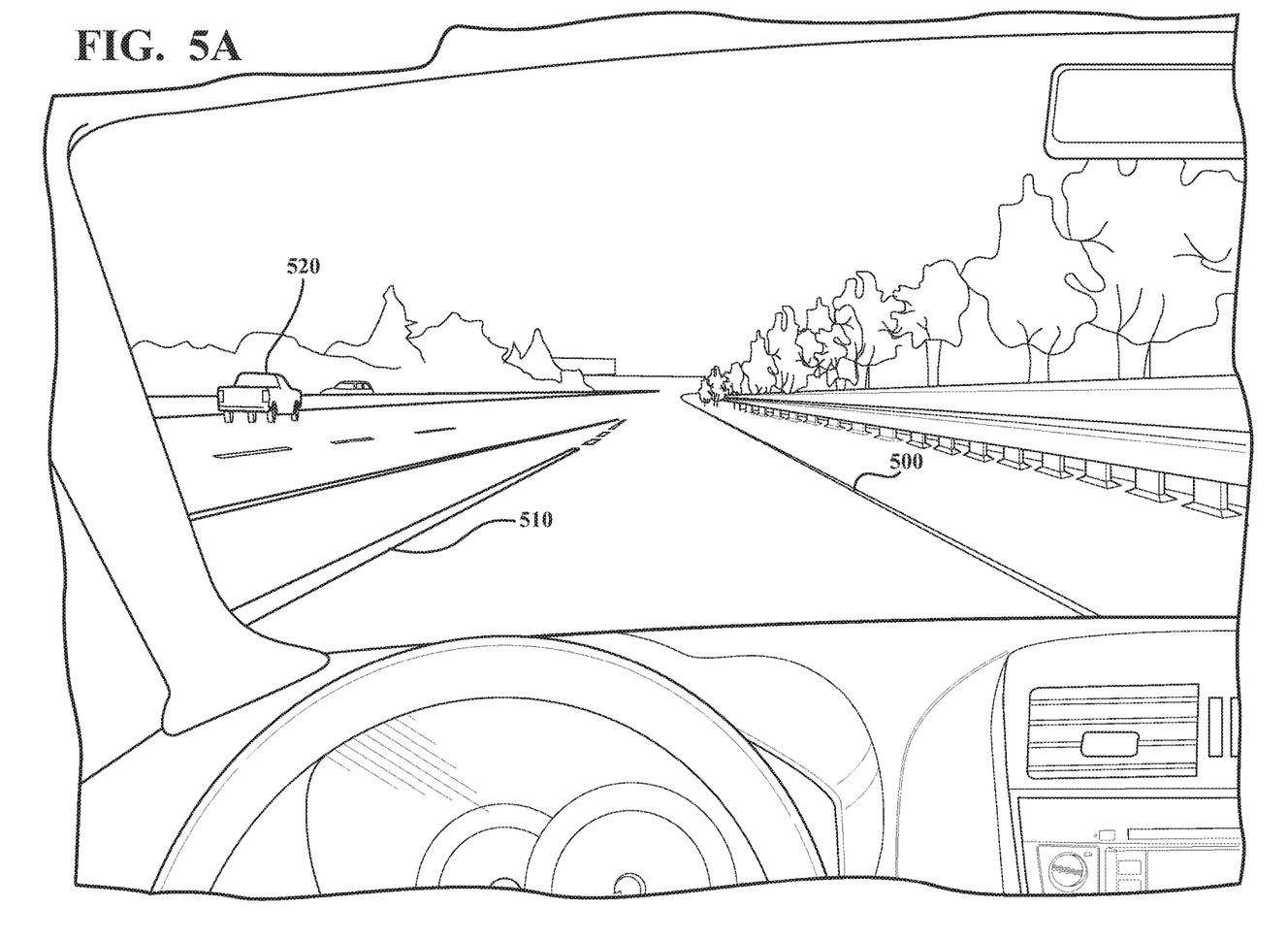
FIG. 5A and FIG. 5B is an illustration of an example modified visualization that may be presented to an operator.
Figure 5B:
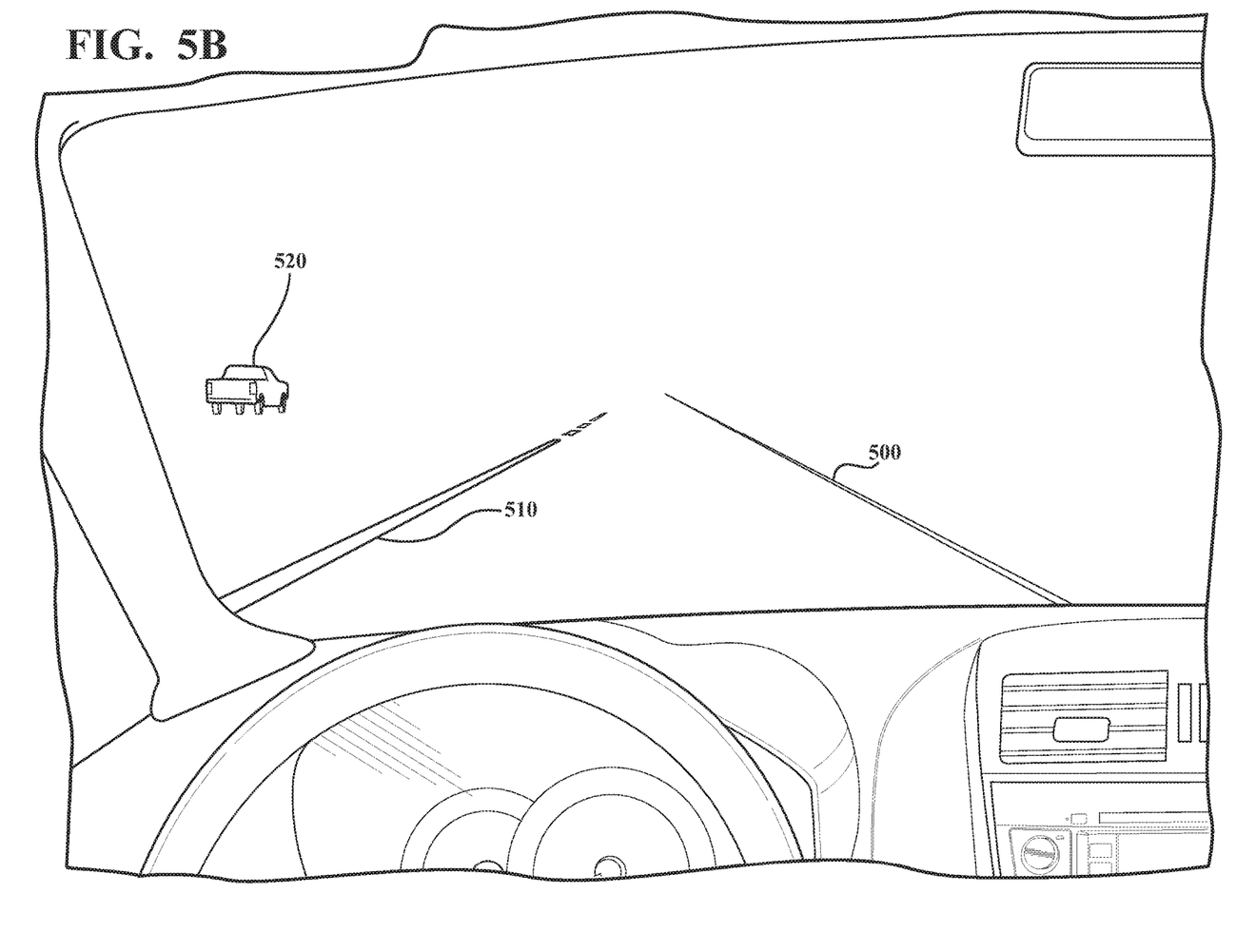

As further explanation of how the perception system 170 modifies and selects which information is displayed to the operator, consider FIG. 5. FIG. 5 includes FIG. 5A and FIG. 5B. FIG. 5A illustrates a full rendering of the simulated environment as may be displayed to the operator without any modifications by the scene module 220. Thus, FIG. 5A includes lane markers 500 and 510, a truck 520 traveling on the same road, additional scenery, buildings, and so on. However, a modified form of the simulated environment from FIG. 5A is shown in FIG. 5B. Thus, as shown in FIG. 5B a majority of the scene has been redacted while certain features (e.g., 500, 510, and 520) which may also be highlighted with bounding boxes (not illustrated). In this example, the perception system 170 has selected a visualization algorithm that highlights particular aspects of the scene that are directly relevant to near-term maneuvers of the vehicle 100.

Figure 6A:
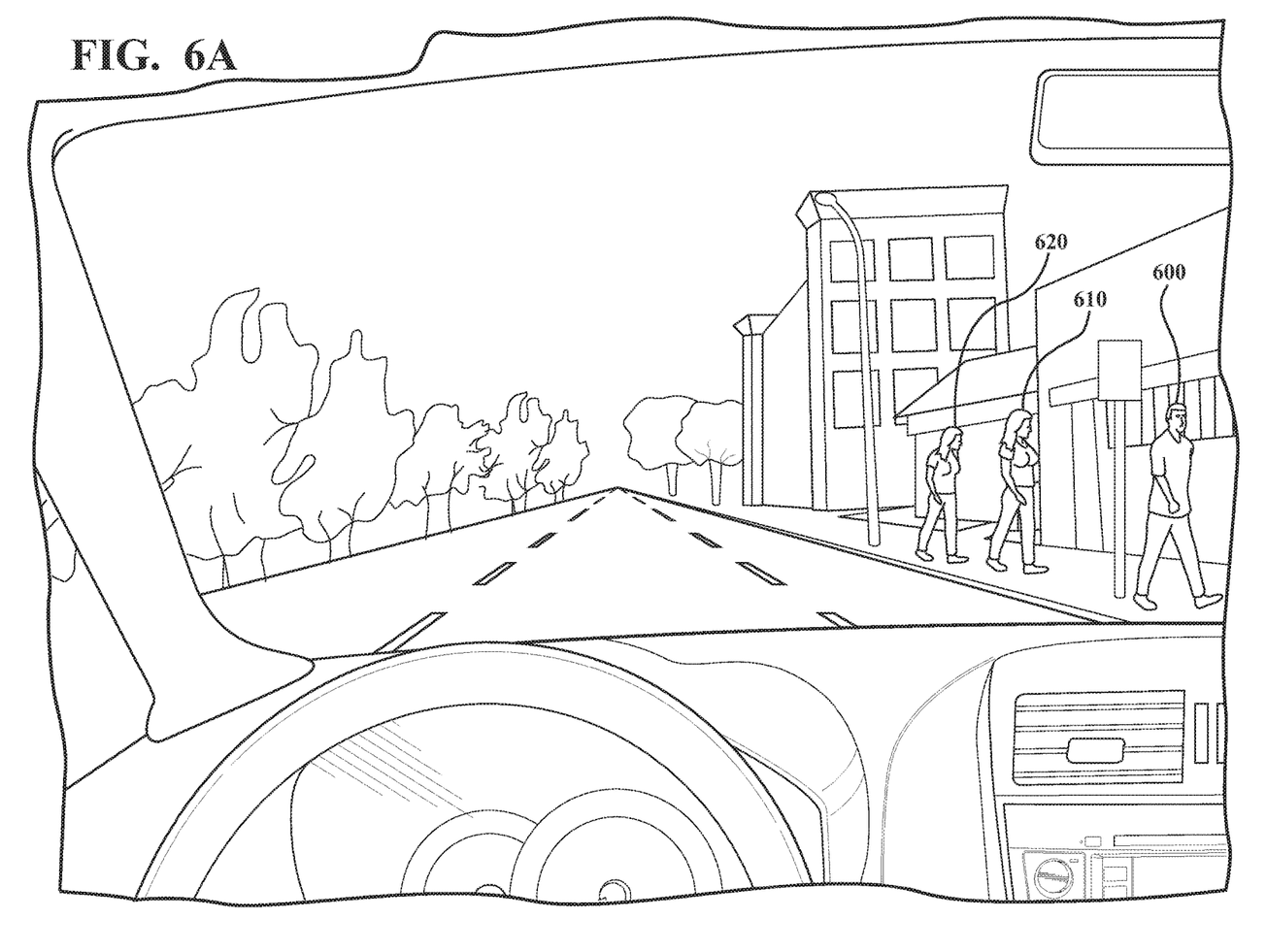
FIG. 6A and FIG. 6B is another illustration of an example modified visualization that may be presented to an operator.
Figure 6B:
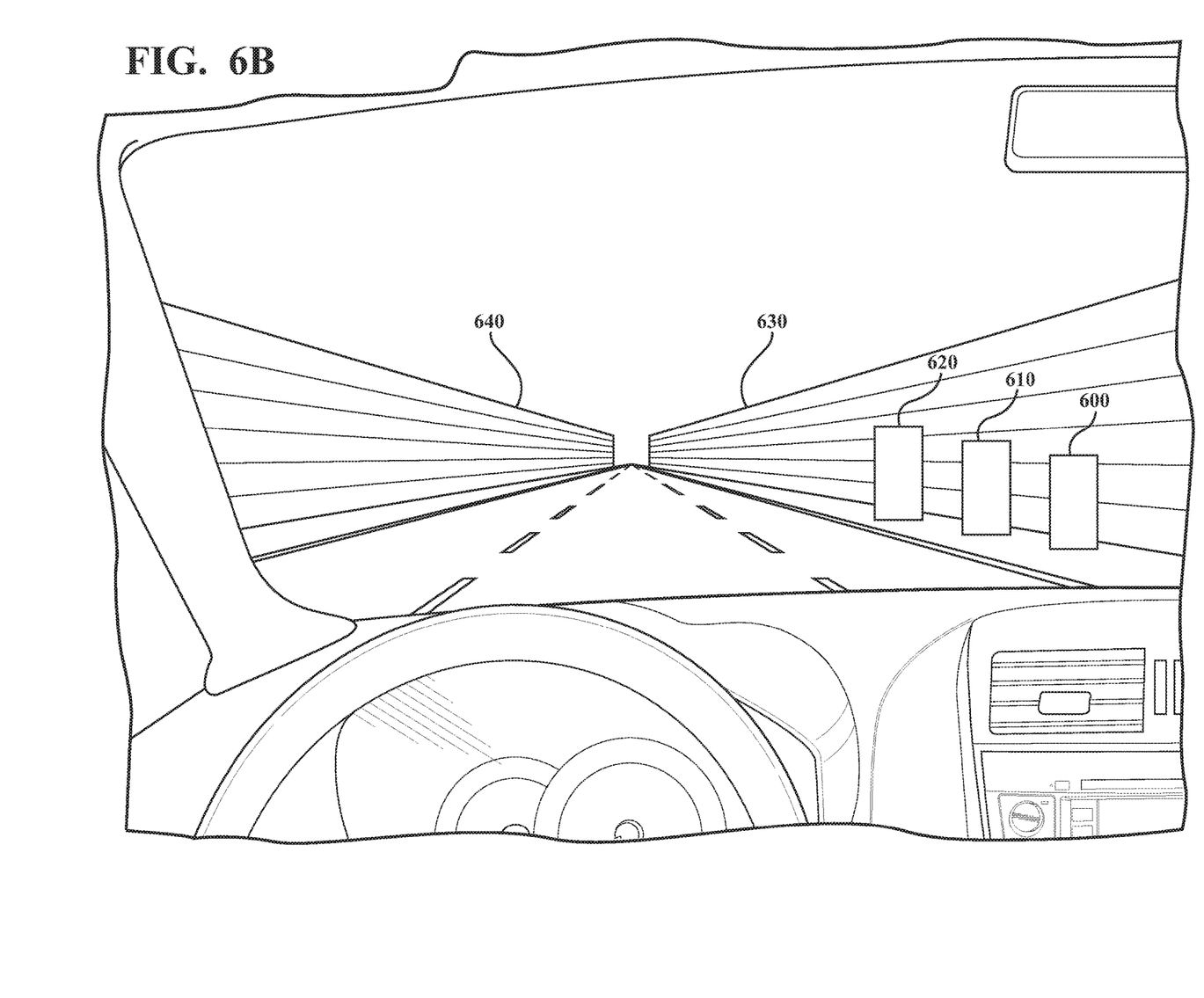

An additional example is shown along with FIGS. 6A and 6B. In FIG. 6A the full simulated environment of the driving scene is displayed. FIG. 6A includes a roadway, pedestrians 600, 610, 620, buildings lining the roadway, trees lining the roadway, and so on. However, once processed by the perception system 170, as shown in FIG. 6B, the pedestrians are replaced with simple bounding boxes and the buildings and shrubbery are replaced with plain walls 630 and 640 to simply indicate the presence of impassable areas. Thus, the perception system 170 provides a visualization of machine vision techniques that simplify perception of the environment instead of distinguishing exact features which may not be useful in determining how to control the vehicle 100.

FIG. 1 will now be discussed in full detail as an example environment within which the system and methods disclosed herein may operate. In some instances, the vehicle 100 is configured to switch selectively between an autonomous mode, one or more semi-autonomous operational modes, and/or a manual mode. Such switching can be implemented in a suitable manner, now known or later developed. "Manual mode" means that all of or a majority of the navigation and/or maneuvering of the vehicle is performed according to inputs received from a user (e.g., human driver). In one or more arrangements, the vehicle 100 can be a conventional vehicle that is configured to operate in only a manual mode.

In one or more embodiments, the vehicle 100 is an autonomous vehicle. As used herein, "autonomous vehicle" refers to a vehicle that operates in an autonomous mode. "Autonomous mode" refers to navigating and/or maneuvering the vehicle 100 along a travel route using one or more computing systems to control the vehicle 100 with minimal or no input from a human driver. In one or more embodiments, the vehicle 100 is highly automated or completely automated. In one embodiment, the vehicle 100 is configured with one or more semi-autonomous operational modes in which one or more computing systems perform a portion of the navigation and/or maneuvering of the vehicle along a travel route, and a vehicle operator (i.e., driver) provides inputs to the vehicle to perform a portion of the navigation and/or maneuvering of the vehicle 100 along a travel route.

The vehicle 100 can include one or more processors 110. In one or more arrangements, the processor(s) 110 can be a main processor of the vehicle 100. For instance, the processor(s) 110 can be an electronic control unit (ECU). The vehicle 100 can include one or more data stores 115 for storing one or more types of data. The data store 115 can include volatile and/or non-volatile memory. Examples of suitable data stores 115 include RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The data store 115 can be a component of the processor(s) 110, or the data store 115 can be operatively connected to the processor(s) 110 for use thereby. The term "operatively connected," as used throughout this description, can include direct or indirect connections, including connections without direct physical contact.

In one or more arrangements, the one or more data stores 115 can include map data 116. The map data 116 can include maps of one or more geographic areas. In some instances, the map data 116 can include information or data on roads, traffic control devices, road markings, structures, features, and/or landmarks in the one or more geographic areas. The map data 116 can be in any suitable form. In some instances, the map data 116 can include aerial views of an area. In some instances, the map data 116 can include ground views of an area, including 360-degree ground views. The map data 116 can include measurements, dimensions, distances, and/or information for one or more items included in the map data 116 and/or relative to other items included in the map data 116. The map data 116 can include a digital map with information about road geometry. The map data 116 can be high quality and/or highly detailed.

In one or more arrangements, the map data 116 can include one or more terrain maps 117. The terrain map(s) 117 can include information about the ground, terrain, roads, surfaces, and/or other features of one or more geographic areas. The terrain map(s) 117 can include elevation data in the one or more geographic areas. The map data 116 can be high quality and/or highly detailed. The terrain map(s) 117 can define one or more ground surfaces, which can include paved roads, unpaved roads, land, and other things that define a ground surface.

In one or more arrangements, the map data 116 can include one or more static obstacle maps 118. The static obstacle map(s) 118 can include information about one or more static obstacles located within one or more geographic areas. A "static obstacle" is a physical object whose position does not change or substantially change over a period of time and/or whose size does not change or substantially change over a period of time. Examples of static obstacles include trees, buildings, curbs, fences, railings, medians, utility poles, statues, monuments, signs, benches, furniture, mailboxes, large rocks, hills. The static obstacles can be objects that extend above ground level. The one or more static obstacles included in the static obstacle map(s) 118 can have location data, size data, dimension data, material data, and/or other data associated with it. The static obstacle map(s) 118 can include measurements, dimensions, distances, and/or information for one or more static obstacles. The static obstacle map(s) 118 can be high quality and/or highly detailed. The static obstacle map(s) 118 can be updated to reflect changes within a mapped area.

The one or more data stores 115 can include sensor data 119. In this context, "sensor data" means any information about the sensors that the vehicle 100 is equipped with, including the capabilities and other information about such sensors. As will be explained below, the vehicle 100 can include the sensor system 120. The sensor data 119 can relate to one or more sensors of the sensor system 120. As an example, in one or more arrangements, the sensor data 119 can include information on one or more LIDAR sensors 124 of the sensor system 120.

In some instances, at least a portion of the map data 116 and/or the sensor data 119 can be located in one or more data stores 115 located onboard the vehicle 100. Alternatively, or in addition, at least a portion of the map data 116 and/or the sensor data 119 can be located in one or more data stores 115 that are located remotely from the vehicle 100.

As noted above, the vehicle 100 can include the sensor system 120. The sensor system 120 can include one or more sensors. "Sensor" means any device, component and/or system that can detect, and/or sense something. The one or more sensors can be configured to detect, and/or sense in real-time. As used herein, the term "real-time" means a level of processing responsiveness that a user or system senses as sufficiently immediate for a particular process or determination to be made, or that enables the processor to keep up with some external process.

In arrangements in which the sensor system 120 includes a plurality of sensors, the sensors can work independently from each other. Alternatively, two or more of the sensors can work in combination with each other. In such case, the two or more sensors can form a sensor network. The sensor system 120 and/or the one or more sensors can be operatively connected to the processor(s) 110, the data store(s) 115, and/or another element of the vehicle 100 (including any of the elements shown in FIG. 1). The sensor system 120 can acquire data of at least a portion of the external environment of the vehicle 100 (e.g., nearby vehicles).

The sensor system 120 can include any suitable type of sensor. Various examples of different types of sensors will be described herein. However, it will be understood that the embodiments are not limited to the particular sensors described. The sensor system 120 can include one or more vehicle sensors 121. The vehicle sensor(s) 121 can detect, determine, and/or sense information about the vehicle 100 itself. In one or more arrangements, the vehicle sensor(s) 121 can be configured to detect, and/or sense position and orientation changes of the vehicle 100, such as, for example, based on inertial acceleration. In one or more arrangements, the vehicle sensor(s) 121 can include one or more accelerometers, one or more gyroscopes, an inertial measurement unit (IMU), a dead-reckoning system, a global navigation satellite system (GNSS), a global positioning system (GPS), a navigation system 147, and/or other suitable sensors. The vehicle sensor(s) 121 can be configured to detect, and/or sense one or more characteristics of the vehicle 100. In one or more arrangements, the vehicle sensor(s) 121 can include a speedometer to determine a current speed of the vehicle 100.

Alternatively, or in addition, the sensor system 120 can include one or more environment sensors 122 configured to acquire, and/or sense driving environment data. "Driving environment data" includes data or information about the external environment in which an autonomous vehicle is located or one or more portions thereof. For example, the one or more environment sensors 122 can be configured to detect, quantify and/or sense obstacles in at least a portion of the external environment of the vehicle 100 and/or information/data about such obstacles. Such obstacles may be stationary objects and/or dynamic objects. The one or more environment sensors 122 can be configured to detect, measure, quantify and/or sense other things in the external environment of the vehicle 100, such as, for example, lane markers, signs, traffic lights, traffic signs, lane lines, crosswalks, curbs proximate the vehicle 100, off-road objects, etc.

Various examples of sensors of the sensor system 120 will be described herein. The example sensors may be part of the one or more environment sensors 122 and/or the one or more vehicle sensors 121. However, it will be understood that the embodiments are not limited to the particular sensors described.

As an example, in one or more arrangements, the sensor system 120 can include one or more radar sensors 123, one or more LIDAR sensors 124, one or more sonar sensors 125, and/or one or more cameras 126. In one or more arrangements, the one or more cameras 126 can be high dynamic range (HDR) cameras or infrared (IR) cameras.

The vehicle 100 can include an input system 130. An "input system" includes any device, component, system, element or arrangement or groups thereof that enable information/data to be entered into a machine. The input system 130 can receive an input from a vehicle passenger (e.g., a driver or a passenger). The vehicle 100 can include an output system 135. An "output system" includes any device, component, or arrangement or groups thereof that enable information/data to be presented to a vehicle passenger (e.g., a person, a vehicle passenger, etc.).

The vehicle 100 can include one or more vehicle systems 140. Various examples of the one or more vehicle systems 140 are shown in FIG. 1. However, the vehicle 100 can include more, fewer, or different vehicle systems. It should be appreciated that although particular vehicle systems are separately defined, each or any of the systems or portions thereof may be otherwise combined or segregated via hardware and/or software within the vehicle 100. The vehicle 100 can include a propulsion system 141, a braking system 142, a steering system 143, throttle system 144, a transmission system 145, a signaling system 146, and/or a navigation system 147. Each of these systems can include one or more devices, components, and/or a combination thereof, now known or later developed.

The navigation system 147 can include one or more devices, applications, and/or combinations thereof, now known or later developed, configured to determine the geographic location of the vehicle 100 and/or to determine a travel route for the vehicle 100. The navigation system 147 can include one or more mapping applications to determine a travel route for the vehicle 100. The navigation system 147 can include a global positioning system, a local positioning system or a geolocation system.

The processor(s) 110, the perception system 170, and/or the autonomous driving module(s) 160 can be operatively connected to communicate with the various vehicle systems 140 and/or individual components thereof. For example, returning to FIG. 1, the processor(s) 110 and/or the autonomous driving module(s) 160 can be in communication to send and/or receive information from the various vehicle systems 140 to control the movement, speed, maneuvering, heading, direction, etc. of the vehicle 100. The processor(s) 110, the perception system 170, and/or the autonomous driving module(s) 160 may control some or all of these vehicle systems 140 and, thus, may be partially or fully autonomous.

The processor(s) 110, the perception system 170, and/or the autonomous driving module(s) 160 can be operatively connected to communicate with the various vehicle systems 140 and/or individual components thereof. For example, returning to FIG. 1, the processor(s) 110, the perception system 170, and/or the autonomous driving module(s) 160 can be in communication to send and/or receive information from the various vehicle systems 140 to control the movement, speed, maneuvering, heading, direction, etc. of the vehicle 100. The processor(s) 110, the perception system 170, and/or the autonomous driving module(s) 160 may control some or all of these vehicle systems 140.

The processor(s) 110, the perception system 170, and/or the autonomous driving module(s) 160 may be operable to control the navigation and/or maneuvering of the vehicle 100 by controlling one or more of the vehicle systems 140 and/or components thereof. For instance, when operating in an autonomous mode, the processor(s) 110, the perception system 170, and/or the autonomous driving module(s) 160 can control the direction and/or speed of the vehicle 100. The processor(s) 110, the perception system 170, and/or the autonomous driving module(s) 160 can cause the vehicle 100 to accelerate (e.g., by increasing the supply of fuel provided to the engine), decelerate (e.g., by decreasing the supply of fuel to the engine and/or by applying brakes) and/or change direction (e.g., by turning the front two wheels). As used herein, "cause" or "causing" means to make, force, compel, direct, command, instruct, and/or enable an event or action to occur or at least be in a state where such event or action may occur, either in a direct or indirect manner.

The vehicle 100 can include one or more actuators 150. The actuators 150 can be any element or combination of elements operable to modify, adjust and/or alter one or more of the vehicle systems 140 or components thereof to responsive to receiving signals or other inputs from the processor(s) 110 and/or the autonomous driving module(s) 160. Any suitable actuator can be used. For instance, the one or more actuators 150 can include motors, pneumatic actuators, hydraulic pistons, relays, solenoids, and/or piezoelectric actuators, just to name a few possibilities.

The vehicle 100 can include one or more modules, at least some of which are described herein. The modules can be implemented as computer-readable program code that, when executed by a processor 110, implement one or more of the various processes described herein. One or more of the modules can be a component of the processor(s) 110, or one or more of the modules can be executed on and/or distributed among other processing systems to which the processor(s) 110 is operatively connected. The modules can include instructions (e.g., program logic) executable by one or more processor(s) 110. Alternatively, or in addition, one or more data store 115 may contain such instructions.

In one or more arrangements, one or more of the modules described herein can include artificial or computational intelligence elements, e.g., neural network, fuzzy logic or other machine learning algorithms. Further, in one or more arrangements, one or more of the modules can be distributed among a plurality of the modules described herein. In one or more arrangements, two or more of the modules described herein can be combined into a single module.

The vehicle 100 can include one or more autonomous driving modules 160. The autonomous driving module(s) 160 can be configured to receive data from the sensor system 120 and/or any other type of system capable of capturing information relating to the vehicle 100 and/or the external environment of the vehicle 100. In one or more arrangements, the autonomous driving module(s) 160 can use such data to generate one or more driving scene models. The autonomous driving module(s) 160 can determine position and velocity of the vehicle 100. The autonomous driving module(s) 160 can determine the location of obstacles, obstacles, or other environmental features including traffic signs, trees, shrubs, neighboring vehicles, pedestrians, etc.

The autonomous driving module(s) 160 can be configured to receive, and/or determine location information for obstacles within the external environment of the vehicle 100 for use by the processor(s) 110, and/or one or more of the modules described herein to estimate position and orientation of the vehicle 100, vehicle position in global coordinates based on signals from a plurality of satellites, or any other data and/or signals that could be used to determine the current state of the vehicle 100 or determine the position of the vehicle 100 with respect to its environment for use in either creating a map or determining the position of the vehicle 100 in respect to map data.

The autonomous driving module(s) 160 either independently or in combination with the perception system 170 can be configured to determine travel path(s), current autonomous driving maneuvers for the vehicle 100, future autonomous driving maneuvers and/or modifications to current autonomous driving maneuvers based on data acquired by the sensor system 120, driving scene models, and/or data from any other suitable source such as determinations from the object models 250 as implemented by the interface module 230. "Driving maneuver" means one or more actions that affect the movement of a vehicle. Examples of driving maneuvers include: accelerating, decelerating, braking, turning, moving in a lateral direction of the vehicle 100, changing travel lanes, merging into a travel lane, and/or reversing, just to name a few possibilities. The autonomous driving module(s) 160 can be configured to implement determined driving maneuvers. The autonomous driving module(s) 160 can cause, directly or indirectly, such autonomous driving maneuvers to be implemented. As used herein, "cause" or "causing" means to make, command, instruct, and/or enable an event or action to occur or at least be in a state where such event or action may occur, either in a direct or indirect manner. The autonomous driving module(s) 160 can be configured to execute various vehicle functions and/or to transmit data to, receive data from, interact with, and/or control the vehicle 100 or one or more systems thereof (e.g., one or more of vehicle systems 140).

Detailed embodiments are disclosed herein. However, it is to be understood that the disclosed embodiments are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations. Various embodiments are shown in FIGS. 1-6, but the embodiments are not limited to the illustrated structure or application.

The flowcharts and block diagrams in the figures illustrate the architecture, functionality, and operation of possible implementations of systems, methods, and computer program products according to various embodiments. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The systems, components and/or processes described above can be realized in hardware or a combination of hardware and software and can be realized in a centralized fashion in one processing system or in a distributed fashion where different elements are spread across several interconnected processing systems. Any kind of processing system or another apparatus adapted for carrying out the methods described herein is suited. A typical combination of hardware and software can be a processing system with computer-usable program code that, when being loaded and executed, controls the processing system such that it carries out the methods described herein. The systems, components and/or processes also can be embedded in a computer-readable storage, such as a computer program product or other data programs storage device, readable by a machine, tangibly embodying a program of instructions executable by the machine to perform methods and processes described herein. These elements also can be embedded in an application product which comprises all the features enabling the implementation of the methods described herein and, which when loaded in a processing system, is able to carry out these methods.

Furthermore, arrangements described herein may take the form of a computer program product embodied in one or more computer-readable media having computer-readable program code embodied, e.g., stored, thereon. Any combination of one or more computer-readable media may be utilized. The computer-readable medium may be a computer-readable signal medium or a computer-readable storage medium. The phrase "computer-readable storage medium" means a non-transitory storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: a portable computer diskette, a hard disk drive (HDD), a solid-state drive (SSD), a read-only memory (ROM), an erasable programmable read-only memory (EPROM or Flash memory), a portable compact disc read-only memory (CD-ROM), a digital versatile disc (DVD), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

Program code embodied on a computer-readable medium may be transmitted using any appropriate medium, including but not limited to wireless, wireline, optical fiber, cable, RF, etc., or any suitable combination of the foregoing. Computer program code for carrying out operations for aspects of the present arrangements may be written in any combination of one or more programming languages, including an object-oriented programming language such as Java™ Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The phrase "at least one of . . . and . . . " as used herein refers to and encompasses any and all possible combinations of one or more of the associated listed items. As an example, the phrase "at least one of A, B, and C" includes A only, B only, C only, or any combination thereof (e.g., AB, AC, BC or ABC).

Aspects herein can be embodied in other forms without departing from the spirit or essential attributes thereof. Accordingly, reference should be made to the following claims, rather than to the foregoing specification, as indicating the scope hereof.

What is claimed is:

1. A perception system for identifying human-based perception techniques for analyzing a driving scene, comprising:
   one or more processors;
   a memory communicably coupled to the one or more processors and storing:
   a scene module including instructions that when executed by the one or more processors cause the one or more processors to generate the driving scene as a simulated environment of a vehicle,
   wherein the scene module includes instructions to modify the simulated environment according to a visualization algorithm that approximates a machine vision technique to transform the simulated environment into a modified environment with redacted information in comparison to the simulated environment; and
   an interface module including instructions that when executed by the one or more processors cause the one or more processors to display the modified environment on an electronic display to an operator,
   wherein the interface module includes instructions to assess how the operator perceives the modified environment when operating the vehicle according to the modified environment displayed on the electronic display.

2. The perception system of claim 1, wherein the scene module includes instructions to select the visualization algorithm according to attributes of the driving scene, and from a set of visualization algorithms that correlate with respective machine vision techniques for perceiving aspects of a surrounding environment of the vehicle,
   wherein the set of visualization algorithms visually approximate how the respective machine vision techniques perceive the driving scene by visualizing the redacted information that is a subset of simulated information that is available about the driving scene.

3. The perception system of claim 1, wherein the scene module includes instructions to dynamically select the driving scene to include varying objects and road conditions to assess how the operator perceives different and changing aspects of the simulated environment, and wherein the driving scene includes a roadway on which the vehicle is traveling and simulated objects within the simulated environment.

4. The perception system of claim 1, wherein the interface module includes instructions to assess the operator including instructions to, in response to displaying the modified environment, monitor electronic inputs of the vehicle that are generated by the operator to determine whether the electronic inputs satisfy a driving threshold, and
   wherein the driving threshold indicates whether the vehicle is being adequately controlled through the driving scene.

5. The perception system of claim 1, wherein the scene module includes instructions to modify the simulated environment include instructions to dynamically change the visualization algorithm used to generate the modified environment based, at least in part, on changes within the driving scene, attributes of the machine vision technique, and whether electronic inputs provided by the operator to control the vehicle satisfy a driving threshold.

6. The perception system of claim 1, wherein the interface module includes instructions to analyze, using a machine learning algorithm, the modified environment in relation to the simulated environment and whether electronic controls provided by the operator satisfied a driving threshold to identify whether the machine vision technique associated with the visualization algorithm includes adequate information for the operator to sufficiently control the vehicle.

7. The perception system of claim 1, wherein the visualization algorithm applies one or more techniques to modify which aspects of the driving scene are displayed to the operator including one or more of: image segmentation to provide a segment of the driving scene as the modified environment, color adaptation to isolate one or more objects of the driving scene, detail adjustment, and bounding box highlighting to modify select aspects of the simulated environment.

8. The perception system of claim 1, wherein the vehicle is a driving simulator for simulating the driving scene to the operator using at least the electronic display and accepting manual driver inputs that are translated into electronic inputs corresponding with the manual driver inputs for the driving scene, and
   wherein the perception system is integrated within the driving simulator.

9. A non-transitory computer-readable medium for identifying human-based perception techniques for analyzing a driving scene and including instructions that when executed by one or more processors cause the one or more processors to:
   generate the driving scene as a simulated environment of a vehicle;
   modify the simulated environment according to a visualization algorithm that approximates a machine vision technique to transform the simulated environment into a modified environment with redacted information in comparison to the simulated environment;
   display the modified environment on an electronic display to an operator; and
   assess how the operator perceives the modified environment when operating the vehicle according to the modified environment displayed on the electronic display.

10. The non-transitory computer-readable medium of claim 9, wherein the instructions to select the visualization algorithm include instructions to select the visualization algorithm according to attributes of the driving scene, and from a set of visualization algorithms that correlate with respective machine vision techniques for perceiving aspects of a surrounding environment of the vehicle,
   wherein the set of visualization algorithms visually approximate how the respective machine vision techniques perceive the driving scene by visualizing the redacted information that is a subset of simulated information that is available about the driving scene.

11. The non-transitory computer-readable medium of claim 9, further including instructions to wherein the instructions to, in response to displaying the modified environment, monitor electronic inputs of the vehicle that are generated by an operator to determine whether the electronic inputs satisfy a driving threshold, and wherein the driving threshold indicates whether the vehicle is being adequately controlled through the driving scene.

12. The non-transitory computer-readable medium of claim 9, wherein the instructions to modify the simulated environment include instructions to dynamically change the visualization algorithm used to generate the modified environment based, at least in part, on changes within the driving scene, attributes of the machine vision technique, and whether electronic inputs from the operator satisfy a driving threshold.

13. The non-transitory computer-readable medium of claim 9, wherein the instructions further include instructions to analyze, using a machine learning algorithm, the modified environment in relation to the simulated environment and whether electronic controls provided by the operator satisfied a driving threshold to identify whether the machine vision technique associated with the visualization algorithm includes adequate information for the operator to sufficiently control the vehicle.

14. A method of identifying human-based perception techniques for analyzing a driving scene, comprising:
   generating the driving scene as a simulated environment of a vehicle;
   modifying the simulated environment according to a visualization algorithm that approximates a machine vision technique to transform the simulated environment into a modified environment with redacted information in comparison to the simulated environment;
   displaying the modified environment on an electronic display to an operator; and
   assessing how the operator perceives the modified environment when operating the vehicle according to the modified environment displayed on the electronic display.

15. The method of claim 14, further comprising:
   selecting the visualization algorithm according to attributes of the driving scene, wherein the visualization algorithm is selected from a set of visualization algorithms that correlate with distinct machine vision techniques for perceiving aspects of a surrounding environment of the vehicle,
   wherein the set of visualization algorithms visually approximate how the respective machine vision techniques perceive the driving scene by visualizing the redacted information that is a subset of simulated information that is available.

16. The method of claim 14, wherein the driving scene is dynamically selected to include varying objects and road conditions to assess how the operator perceives different and changing aspects of the simulated environment.

17. The method of claim 14,
   wherein assessing the operator includes, in response to displaying the modified environment, monitoring electronic inputs of the vehicle that are generated by the operator to determine whether the electronic inputs satisfy a driving threshold that indicates whether the vehicle is being adequately controlled through the driving scene, and
   wherein the electronic inputs include control inputs to the vehicle resulting from the operator manually manipulating control input devices of the vehicle.

18. The method of claim 14, wherein modifying the simulated environment includes dynamically changing the visualization algorithm used to generate the modified environment based, at least in part, on changes within the driving scene, attributes of the machine vision technique, and whether electronic inputs from the operator satisfy a driving threshold.

19. The method of claim 14, further comprising:
   analyzing, using a machine learning algorithm, the modified environment in relation to the simulated environment and whether electronic controls provided by the operator satisfied a driving threshold to identify whether the machine vision technique associated with the visualization algorithm includes adequate information for the operator to sufficiently control the vehicle.

20. The method of claim 14, wherein the visualization algorithm applies one or more techniques to modify which aspects of the driving scene are displayed to the operator including one or more of: image segmentation to provide a segment of the driving scene as the modified environment, color adaptation to isolate one or more objects of the driving scene, detail adjustment, and bounding box highlighting to modify select aspects of the simulated environment.

* * * * *